United States Patent
Hung et al.

(10) Patent No.: US 6,620,564 B2
(45) Date of Patent: Sep. 16, 2003

(54) METHOD FOR PATTERNING SEMICONDUCTORS THROUGH ADJUSTMENT OF IMAGE PEAK SIDE LOBES

(75) Inventors: Chi-Yuan Hung, I-Lan (TW); I-Pien Wu, Hsin-Chu (TW)

(73) Assignee: Macronix International Co., Ltd. (TW)

( * ) Notice: Subject to any disclaimer, the term of this patent is extended or adjusted under 35 U.S.C. 154(b) by 42 days.

(21) Appl. No.: 10/060,769

(22) Filed: Feb. 1, 2002

(65) Prior Publication Data

US 2003/0148197 A1 Aug. 7, 2003

(51) Int. Cl.$^7$ .............................. G03F 9/00; G03C 5/00
(52) U.S. Cl. .............................. 430/30; 430/5; 430/311; 430/313
(58) Field of Search .............................. 430/5, 30, 311, 430/313

(56) References Cited

U.S. PATENT DOCUMENTS 5,792,596 A * 8/1998 Yasuzato et al. ............ 430/327
6,335,130 B1 * 1/2002 Chen et al. .................... 430/5

* cited by examiner

*Primary Examiner*—Christopher G. Young

(57) ABSTRACT

First of all, an adjusting step is performed to change a first optical parameter and a second optical parameter, so as to adjust the positions of two side-lobes of the main feature's exposure peak and overlap with the main feature's exposure peak and two side-lobes thereof, wherein the first optical parameter is the Numerical Aperture (NA) and the second optical parameter is the sigma($\sigma$). Afterward, a lithography process is performed by using a translucent mask to pattern the semiconductor devices, wherein the translucent mask can equalize the intensity of the main feature's exposure peak and the side-lobes thereof from each other. Therefore, this invention can reduce the pitch to decrease the critical dimension of the semiconductor devices.

15 Claims, 10 Drawing Sheets

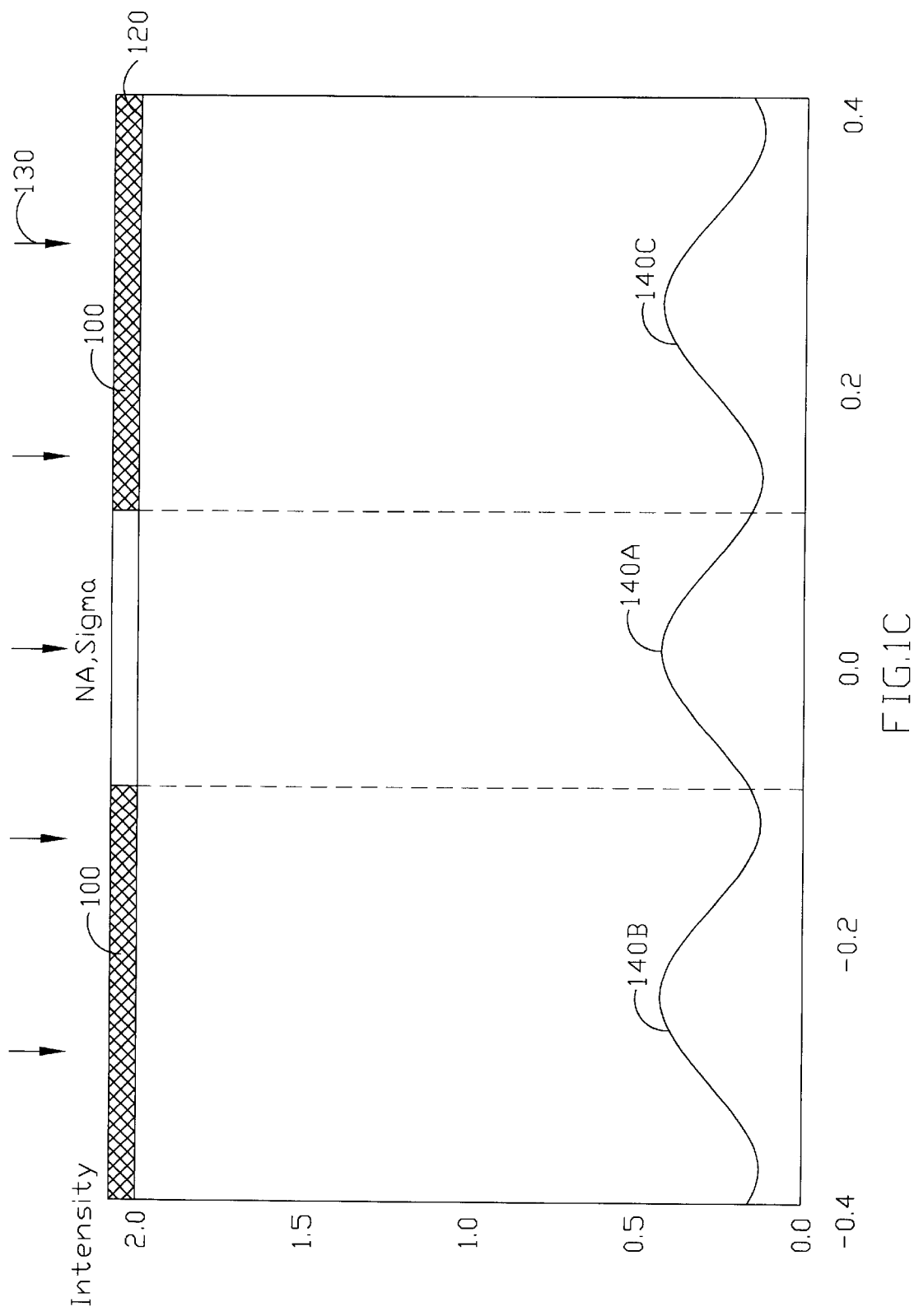

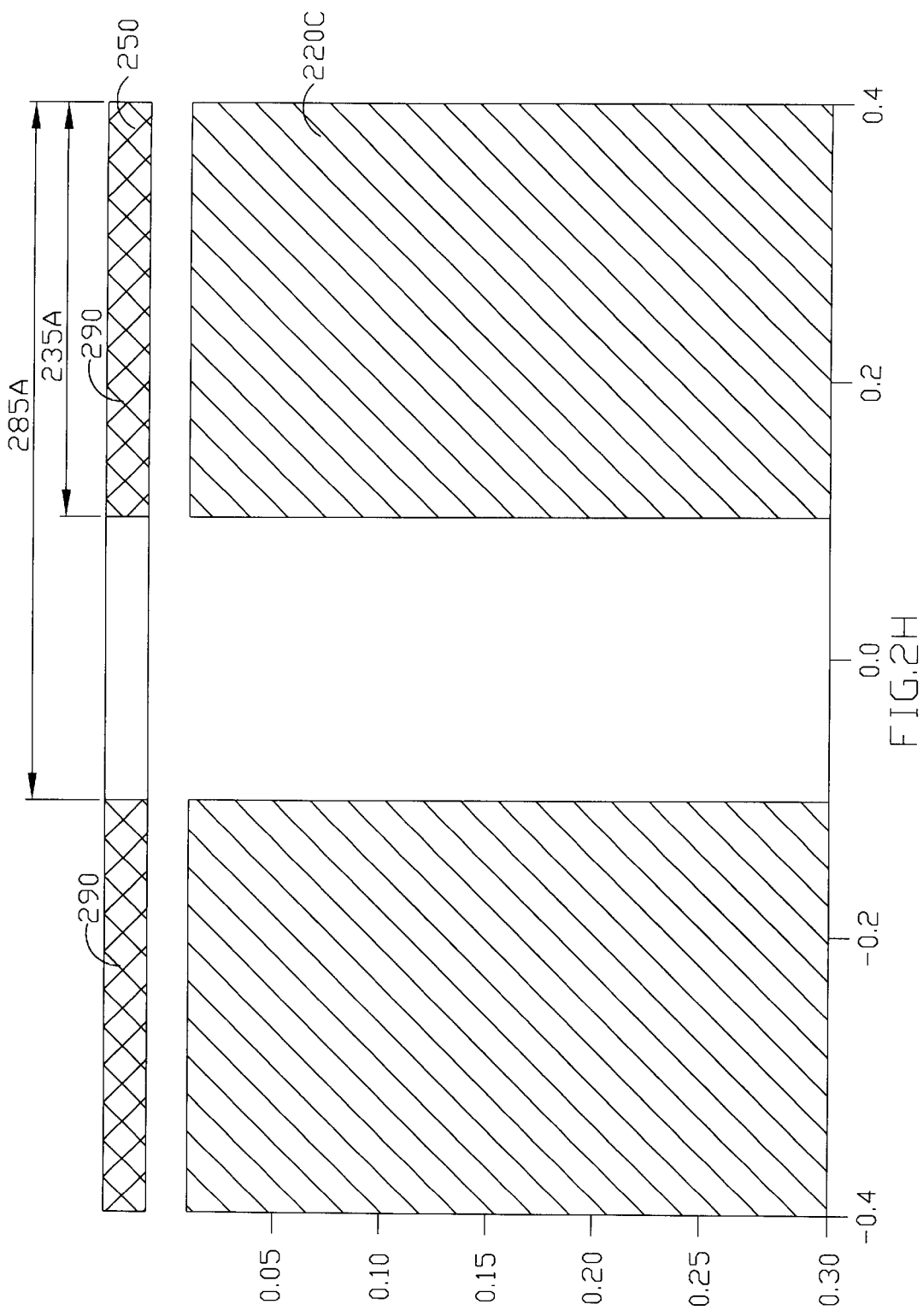

METHOD FOR PATTERNING SEMICONDUCTORS THROUGH ADJUSTMENT OF IMAGE PEAK SIDE LOBES

BACKGROUND OF THE INVENTION

1. Field of the Invention

The present invention relates generally to a method for patterning semiconductors, and more particularly to a method for patterning semiconductors to reduce pitches thereof.

2. Description of the Prior Art

The need to remain competitive in cost and performance in the production of semiconductor devices has caused a continuous increase in device density of integrated circuits. As higher integration and miniaturization has been achieved in a semiconductor integrated circuit, miniaturization of a circuit pattern formed on a semiconductor wafer has also been proceeded. As a basic technique for generating the pattern, photolithography is widely known among others. Therefore, various development and improvements of the photolithography technique has been made. Smaller dimensions permit the fabrication of more devices or other integrated circuit components per unit substrate area. Closer spacing of features yields similar advantages. Design rules define the space tolerance between devices or interconnect lines so as to ensure that the devices or lines do not interact with one another in any unwanted manner. One important layout design rule that tends to determine the overall size and density of the semiconductor device is the critical dimension (CD). A critical dimension of a circuit is commonly defined as the smallest width of a line or the smallest space between two lines. Another critical design rule defines the minimum width of a given feature plus the distance to the adjacent feature edge as the minimum pitch.

Once the layout of the circuit is created, the photolithographic process utilizes an exposure tool to irradiate a layer of photoresist on the wafer through a mask to transfer the pattern on the mask to the wafer. As the critical dimensions of the layout approach the resolution limit of the lithography equipment, optical proximity effects (OPE) begin to influence the manner in which features on a mask transfer to the resist layer such that the masked and actual layout patterns begin to differ. Optical Proximity effects are known to result from optical diffraction in the projection system. The diffraction causes adjacent features to interact with one another in such a way as to produce pattern-dependent variations; the closer together features are, the more proximity effect is seen. One specific proximity effect related problem occurs when features are designed to have the same dimension, but are placed in a different proximity to other features in a layout. Features that have edges that are in close proximity to other features (referred to as in dense area with narrow pitch pattern) are more affected by proximity effects while features that have edges that are relatively isolated are less affected by proximity effects. As a result, a feature in a dense area tends to be printed differently than an isolated feature. That is to say, the narrow pitch pattern is difficult to print due to its poor aerial image contrast, especially for those pitches close to the wavelength of the light source used for exposure. Thus, patterns become increasingly smaller, and the need for improvement in resolution of patterns had been increased.

Generally, the term resolution is defined as a measure of the ability to separate closely spaced features. The resolution limit R (nm) in the photolithography technique using the reduction type projection printing is given by the following equation:

$$R = k_1 * \lambda / (NA)$$

where $\lambda$ is a wavelength (nm) of light for use, NA is the Numerical Aperture of a lens, and $k_1$ is a constant depending on a resist process.

As can be seen from the above equation, in order to improve the resolution limit R to obtain a finer pattern, the values of $k_1$ and $\lambda$ should be reduced, and that of Numerical Aperture (NA) should be increased. In other words, what is required is to reduce the constant dependent on the resist process as well as to shorten the wavelength and to increase the Numerical Aperture (NA). However, enlarging the Numerical Aperture (NA) of projection system and shortening the wavelength of light source is technically difficult and costly. The implantation of costly and complex phase shift masks has significantly improved the resolution in recent years. However, for maximizing the integration of device components in the available area on the substrate to fit more components in the same area, increasing miniaturization are required. Furthermore, in the lithography process of the narrow dimension, it is usually used the photoresist material that is applied for the deep ultraviolet (DUV) process, and that the light source is usually off-axis illumination (OAI), so as to pattern the features of the masks onto wafers within the limitation of the narrow dimension. However, the process window of semiconductor devices can not be reduced without qualifications because the photoresist material of the deep ultraviolet (DUV) process or the off-axis illumination (OAI) has limitation thereof, so that working efficiency for the lithography process is reduced.

In general, the pitches could not be changes by using optical proximity correction (OPC), and further, there are limitation of the pitches in various lithography processes. For example, when the limitation of the pitch in the lithography process is 300 micrometer, the lithography process could not be performed in the condition that the limitation of the pitch is less than 300 micrometer. If it is necessary to reduce the pitch, apparatus of the lithography process will be exchanged form the narrow lines. Moreover, as narrow lines and closer pitch dimensions are needed to achieve increasingly dense packing of the components, the task of reducing proximity effect and increasing the process window of printing the narrow pitch pattern with poor aerial image contrast into the substrate becomes more and more important. Thus, the need for improvement in resolution of patterning the pitches close to the wavelength of light source without considering the limitation of an image transfer system is imperative. In accordance with the above description, a new and improved method for patterning semiconductor devices is therefore necessary, so as to raise the yield and quality of the follow-up process.

SUMMARY OF THE INVENTION

In accordance with the present invention, a method is provided for patterning semiconductor devices that substantially overcomes drawbacks of above mentioned problems raised from the conventional methods.

Accordingly, it is a main object of the present invention to provide a method for patterning semiconductor device. This invention can adjust positions of the side-lobes of the main feature's exposure peak by changing the optical parameters of Numerical Aperture (NA) and sigma ($\sigma$), so as to overlap with its neighborhood's side-lobes. Furthermore, in this invention, the intensity of the main future's exposure peak is about equal to the side-lobes thereof from each other by changing the transmission of the translucent mask. Therefore, the present invention can reduce the pitch so as to obtain the large process window. So, the present invention can correspond to industrial economic effect, and the present invention is appropriate for deep sub-micron technology to provide the semiconductor devices.

In accordance with the present invention, a new method for patterning semiconductor devices is disclosed. First of all, an adjusting step is performed to change a first optical parameter and a second optical parameter, so as to adjust the positions of two side-lobes of the main feature's exposure peak and overlap with the main feature's exposure peak and two side-lobes thereof, wherein the first optical parameter is the Numerical Aperture (NA) and the second optical parameter is the sigma ($\sigma$). Afterward, a lithography process is performed by using a translucent mask to pattern the semiconductor devices, wherein the translucent mask can equalize the intensity of the main feature's exposure peak and the side-lobes thereof from each other. Therefore, this invention can reduce the pitch to decrease the critical dimension of the semiconductor devices.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 1A to FIG. 1C show cross-sectional views illustrative of various stages in the method for patterning semiconductor devices in accordance with the first embodiment of the present invention;

FIG. 2H shows cross-sectional view illustrative of the photoresist regions by the conventional patterning process.

DESCRIPTION OF THE PREFERRED EMBODIMENT

Preferred embodiments of the present invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1A:
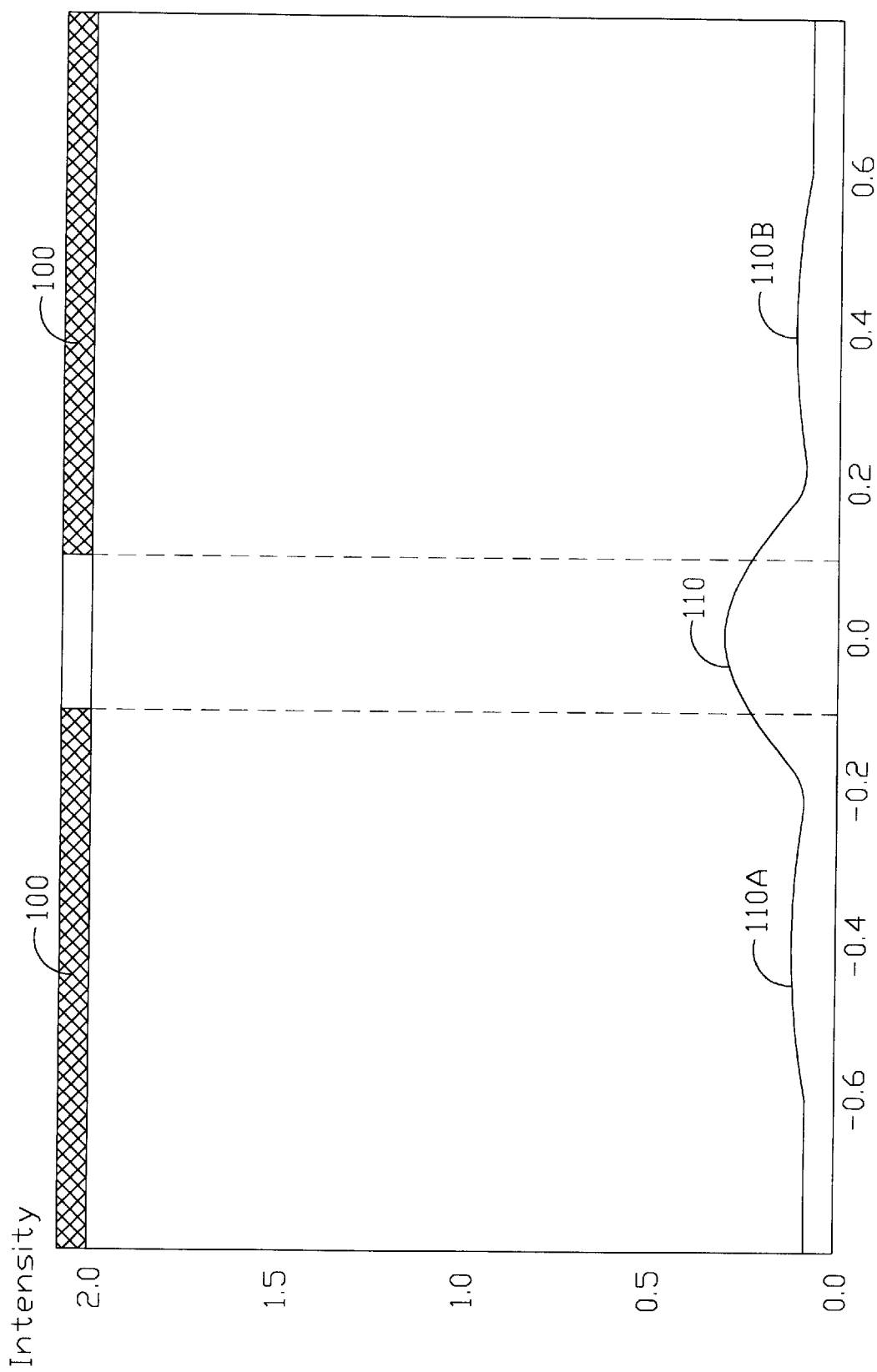
Figure 1B:
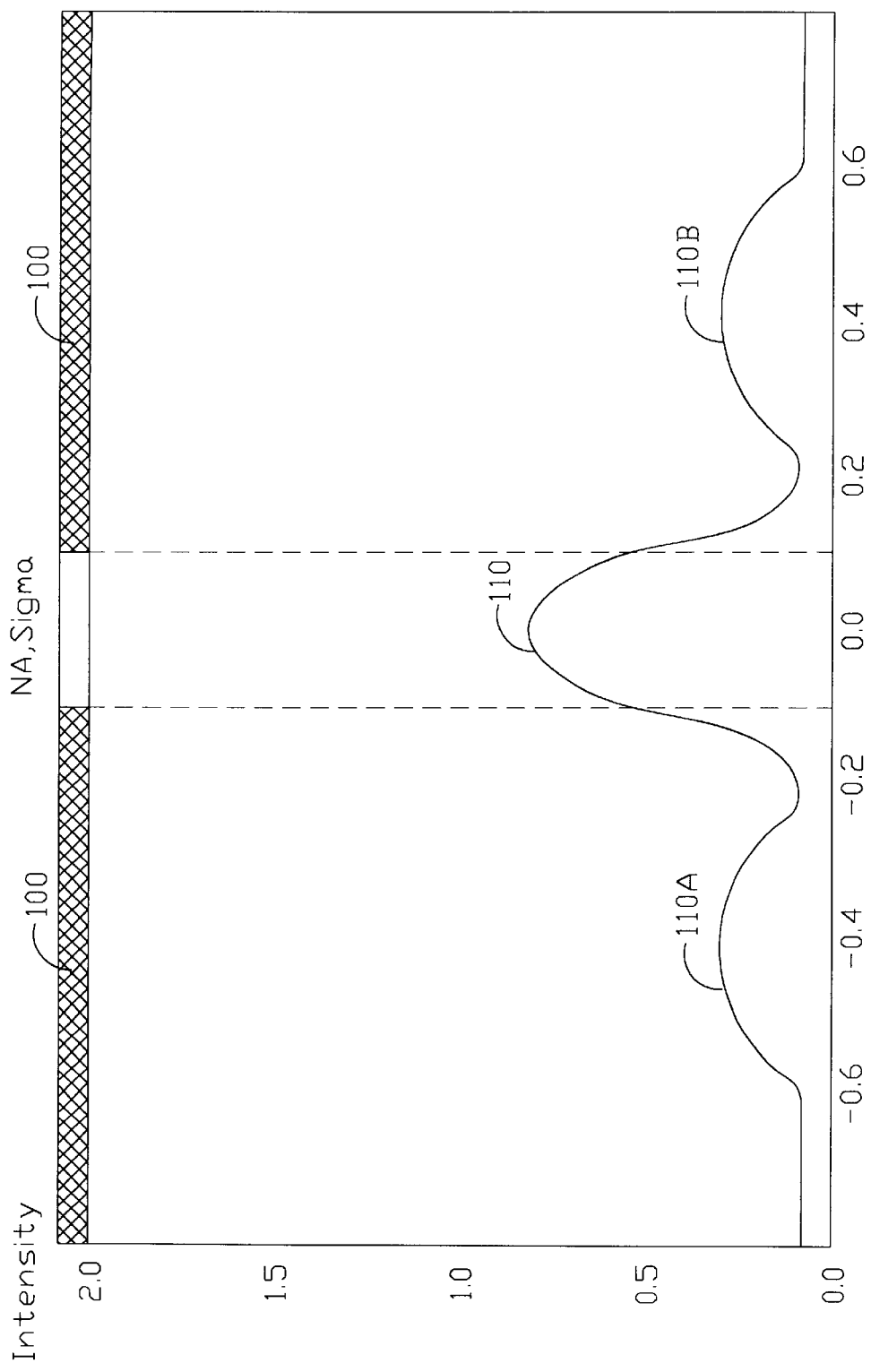

As illustrated in FIG. 1A and FIG. 1B, in the first embodiment of the present invention, first of all, an exposure peak 110 with two side-lobes 110A and 110B beside itself of a main feature 100 is provided, wherein the exposure peak 110 of the main feature 100 is utilized for the lithography process, wherein the exposure peak 110 includes a first pitch. An adjusting step is then performed to change a first optical parameter and a second optical parameter, so as to adjust the positions of two side-lobes 110A and 110B of the exposure peak 110 and overlap with the exposure peak 110 and two side-lobes 110A and 110B thereof, wherein the first optical parameter is the Numerical Aperture (NA) and 20 the second optical parameter is the sigma($\sigma$). Afterward, a lithography process 130 is performed by using a halftone mask 120 with the main feature 100 to equalize the intensity of the exposure peaks 110, side-lobes 110A and 110B from each other, so as to form exposure peaks 140A, 140B and 140C with a second pitch, wherein the second pitch is about less than the first pitch. Therefore, this invention can reduce the pitch to decrease the critical dimension of the semiconductor devices, wherein the transmission of the halftone mask 120 is about between 30% to 50%, as shown in FIG. 1C.

Figure 2A:
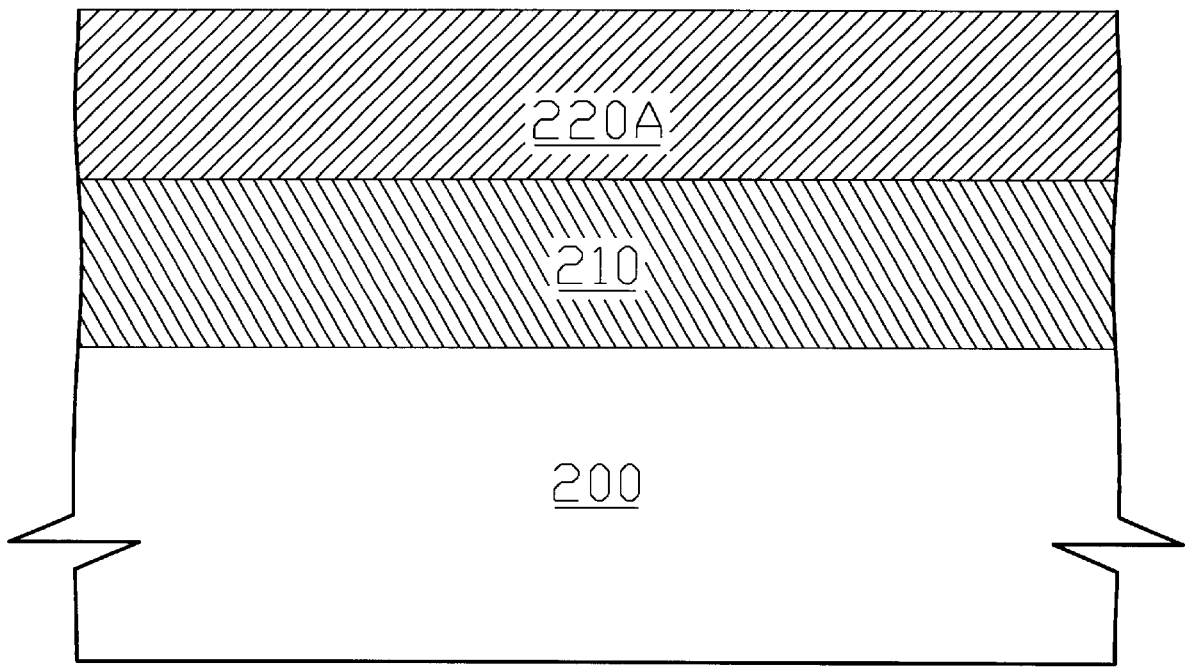
FIGS. 2A to 2G show cross-sectional views illustrative of various stages in the method for forming the trench in accordance with the second embodiment of the present invention.
Figure 2B:
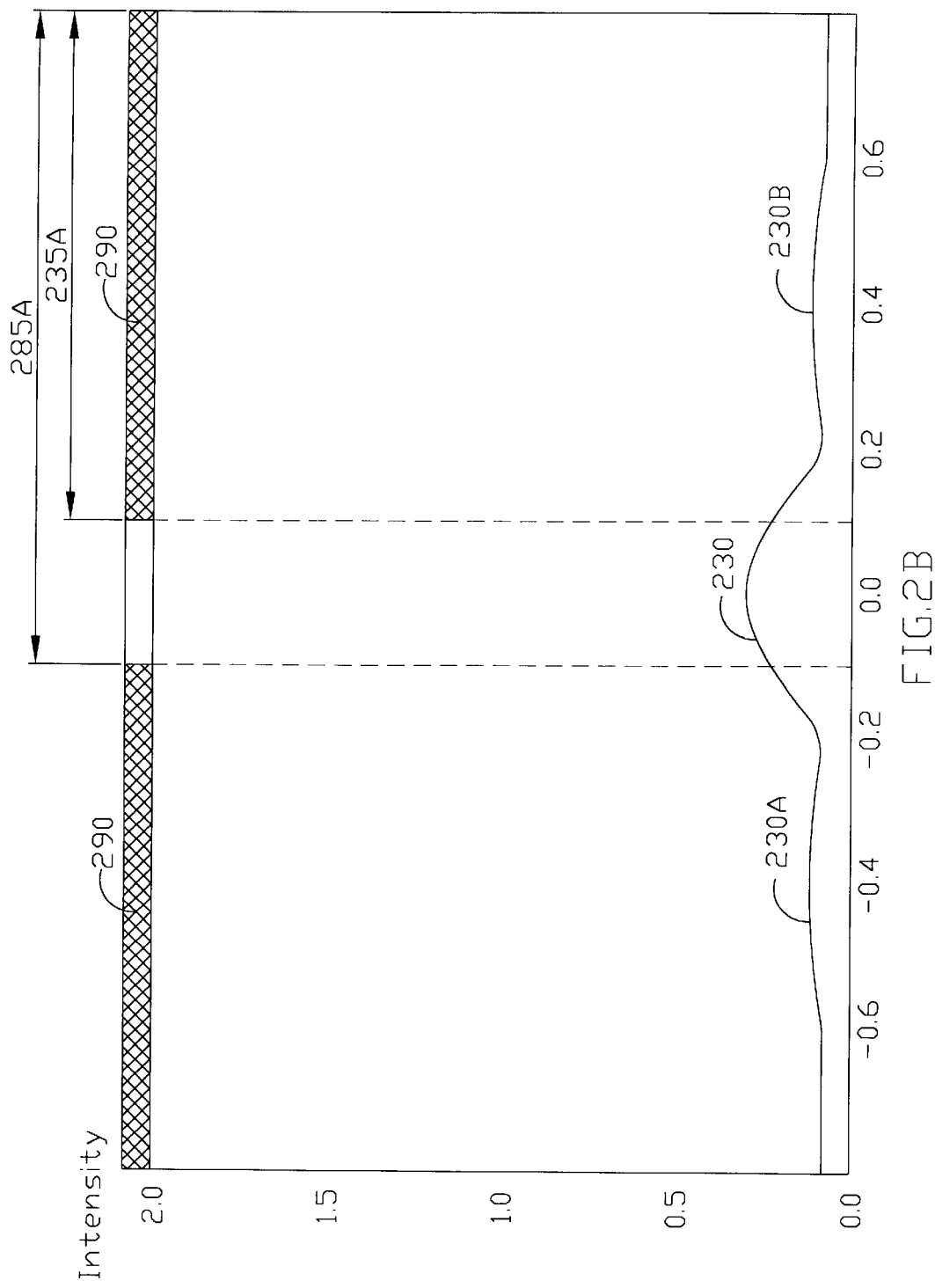
Figure 2C:
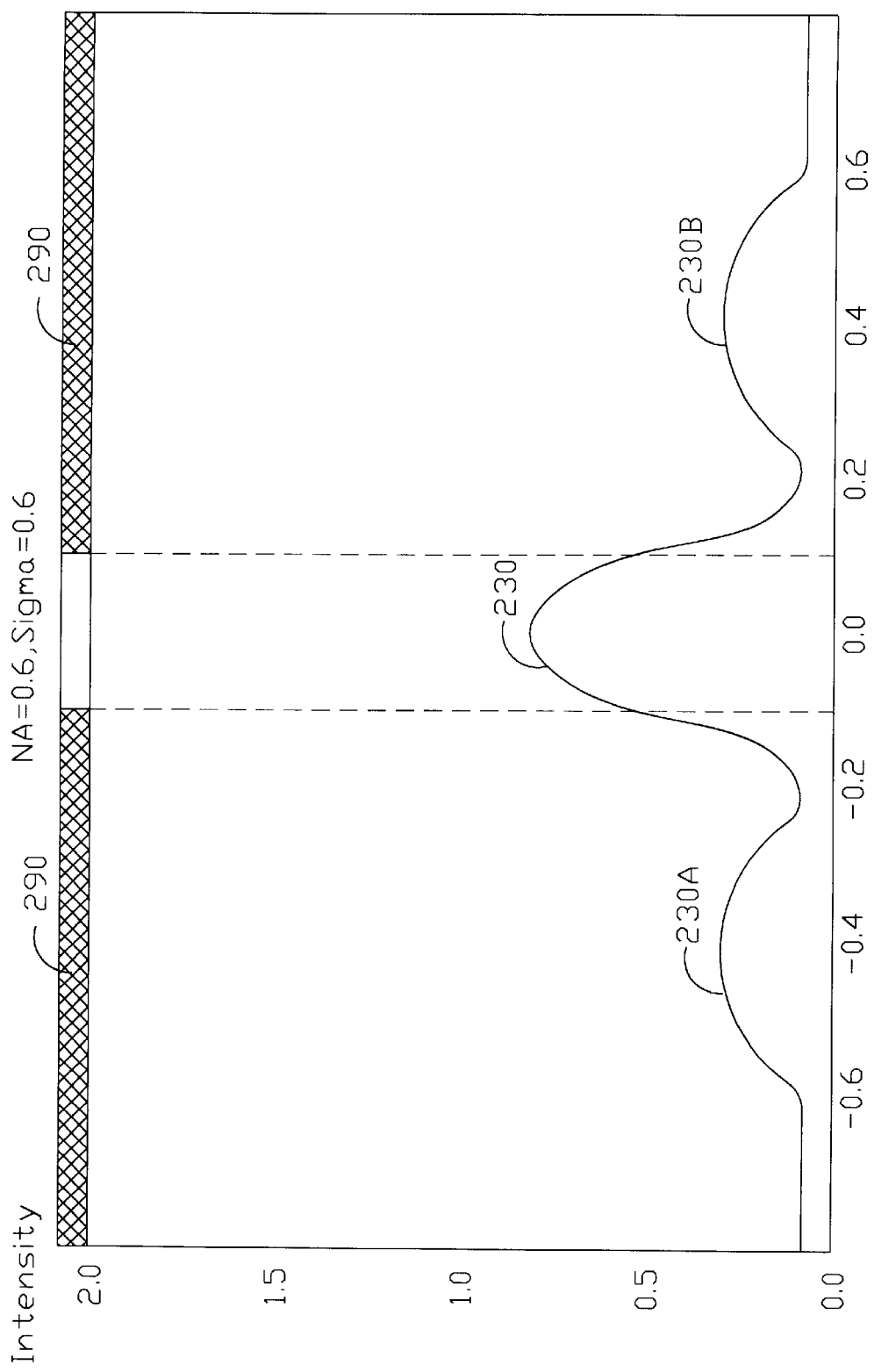
Figure 2D:
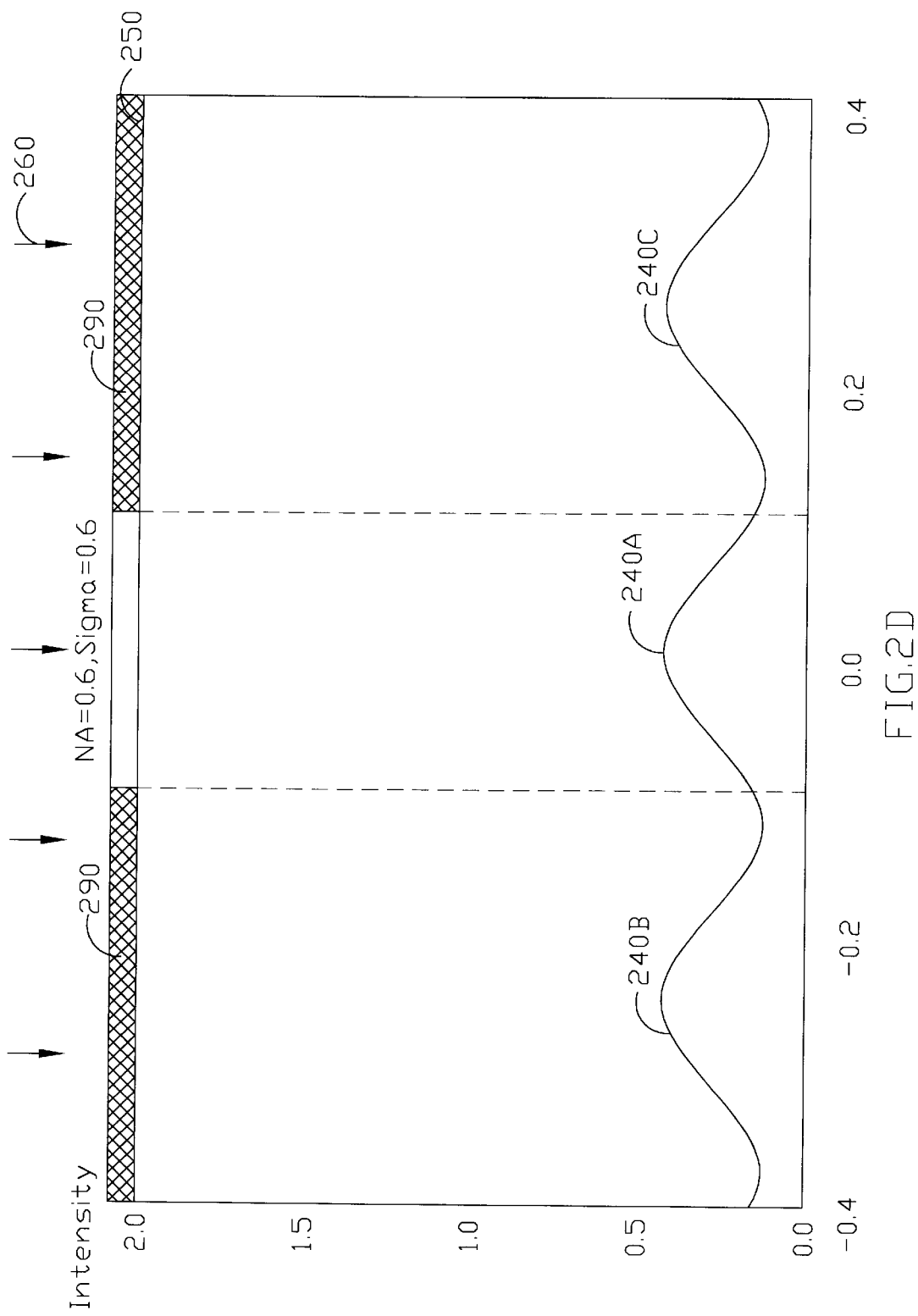
Figure 2E:
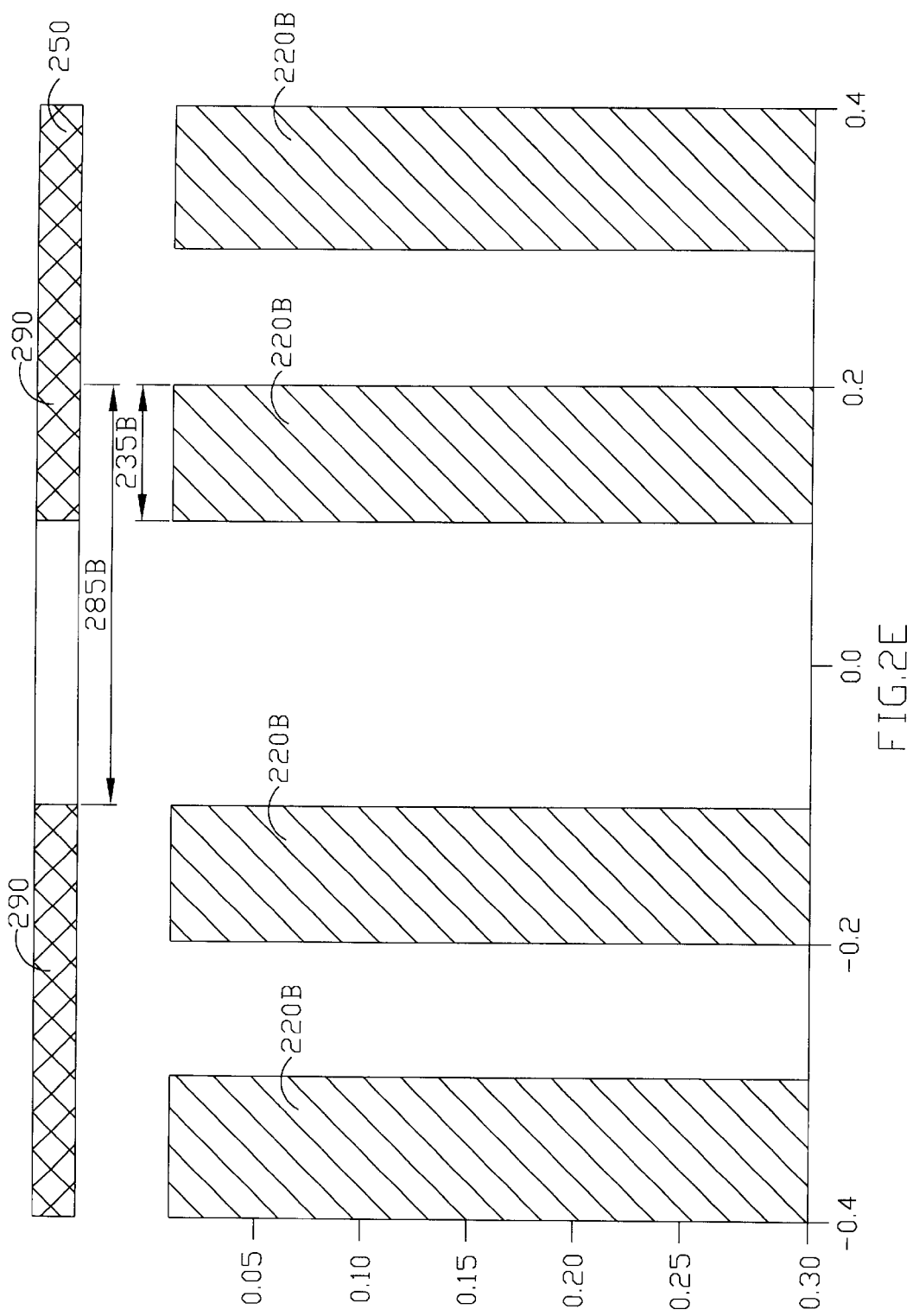
Figure 2F:
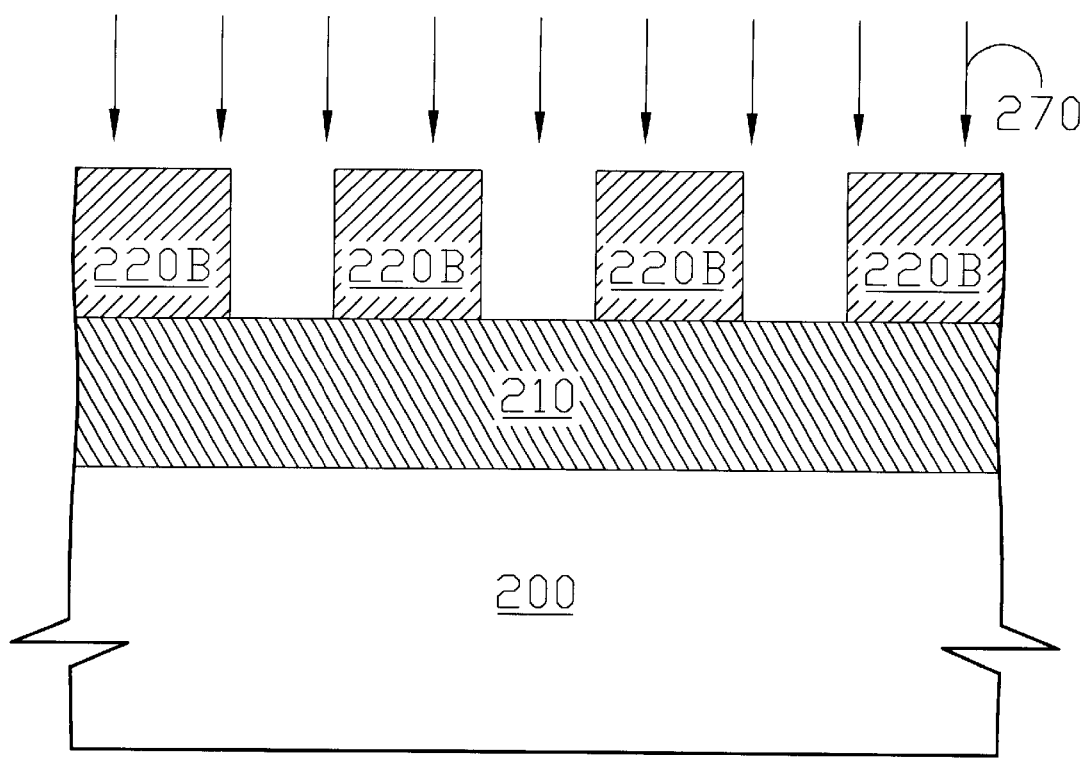
Figure 2G:
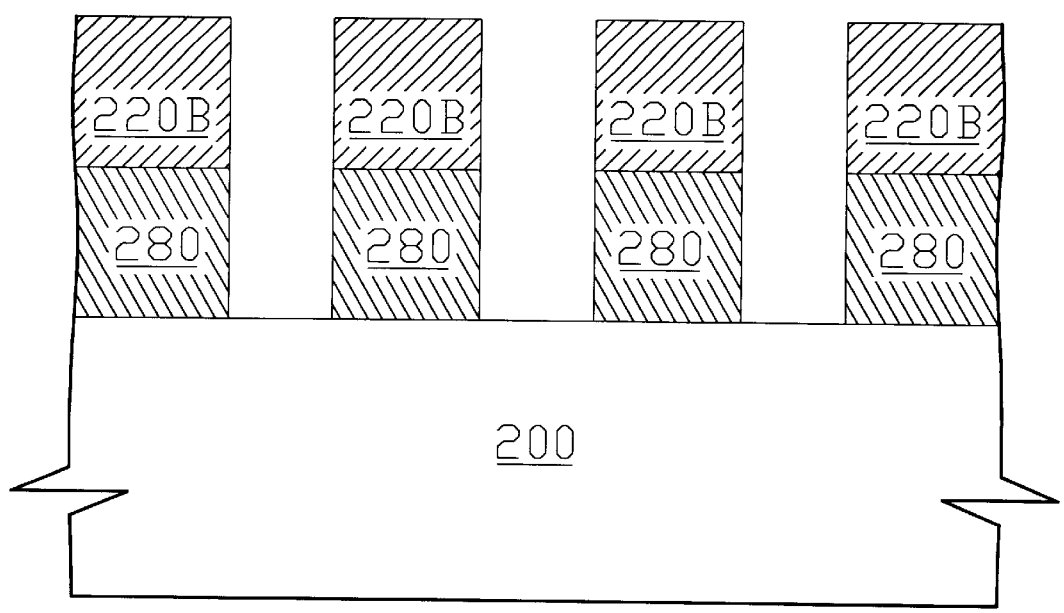

As illustrated in FIG. 2A and FIG. 2B, in the first embodiment of the present invention, first of all, a semiconductor substrate 200 with a semiconductor layer 210 thereon is provided. A photoresist layer 220A is formed on the semiconductor layer 210. Next, a main feature 290 for patterning a semiconductor device is provided, and that the main feature 290 includes a first width 285A, and further, an exposure peak 230 and two side-lobes 230A and 230B thereof are also provided, wherein the exposure peak 230 with a first pitch 235A is applied to pattern the semiconductor device. Afterward, performing an adjusted optical step is to change -a first optical parameter, Numerical Aperture (NA), and a second optical parameter, sigma($\sigma$), so as to adjust the positions of two side-lobes 230A and 230B of the exposure peak 230 and overlap with the exposure peak 230 and two side-lobes 230A and 230B thereof, wherein the first optical parameter is about 0.6, and the second optical parameter is about 0.6. Thereafter, a halftone mask 250 with the main feature 290 is utilized to equalize the intensity of the exposure peaks 230, side-lobes 230A and 230B from each other, so as to form exposure peaks 240A, 240B and 240C with a second pitch 235B that is about half the first pitch. 235A, and then a lithography process 260 is performed by using the halftone mask 250 to form a plurality of photoresist regions 220B with a second width 285B that is about half the first width 285A on the semiconductor layer 210, wherein the transmission of the halftone mask 250 is about 40% , and the lithography process 260 comprises a deep ultraviolet process (DUV), as shown in FIG. 2D and FIG. 2E. Then an etching process 270 for forming the trench is performed by the plurality of photoresist regions 220B as photoresist masks, so as to etch the semiconductor layer 210 and form the plurality of semiconductor regions 280 with the second width 285B on the semiconductor substrate 200, as shown in FIG. 2F and FIG. 2G.

In these embodiments of the present invention, as discussed above, this invention can adjust positions of the side-lobes of the main feature's exposure peak by changing the optical parameters of Numerical Aperture (NA) and sigma ($\sigma$), so as to overlap with its neighborhood's side-lobes. Furthermore, in this invention, the intensity of the main future's exposure peak is about equal to the side-lobes thereof from each other by changing the transmission of the translucent mask. Compare FIG. 2E with FIG. 2H, obviously, the photoresist regions 220C that are formed by the conventional patterning process can be reduced to become the photoresist regions 220B with the smaller width. For the process in 0.25 micrometer, it is easy to reduce the critical dimension directly to 0.125 micrometer without addition of the photolithography process and photomask. Therefore, the present invention can reduce the pitch so as to obtain the large process window. So, the present invention can correspond to industrial economic effect, and the present invention is appropriate for deep sub-micron technology to provide the semiconductor devices.

Of course, it is possible to apply the present invention to the patterning process, and also it is possible to apply the present invention to any etching process or lithography process. Also, this invention can be applied to reduce the pitch in the same patterning process by changing the optical parameters, such as Numerical Aperture (NA) and sigma (σ), and the transmission of the halftone mask, and that these methods has not been developed in aspect concerning lithography process at present. The present invention is the best the process for patterning the semiconductor devices compatible for deep sub-micro process.

Obviously, many modifications and variations of the present invention are possible in light of the above teachings. It is therefore to be understood that within the scope of the appended claims, the present invention may be practiced otherwise than as specifically described herein.

Although specific embodiments have been illustrated and described, it will be obvious to those skilled in the art that various modifications may be made without departing from what is intended to be limited solely by the appended claims.

What is claimed is:

1. A method for forming the exposure peak of the lithography process, the method comprising:

providing a first exposure peak of a main feature that is utilized for said lithography process, wherein a side-lobe is beside on the sidewall of said first exposure peak; and performing an adjusting step to change a first optical parameter and a second optical parameter, so as to adjust the position of said side-lobe of said first exposure peak and form a plurality of second exposure peaks.

2. The method according to claim 1, wherein said first optical parameter comprises a Numerical Aperture (NA) parameter.

3. The method according to claim 1, wherein said second optical parameter comprises a sigma parameter.

4. A method for patterning the semiconductor devices, the method comprising:

providing a first exposure peak of a main feature that is utilized for the lithography process, wherein a side-lobe is beside on the sidewall of said first exposure peak, and said first exposure peak has a first pitch;

performing an adjusting step to change a first optical parameter and a second optical parameter, so as to adjust the position of said side-lobe of said first exposure peak and overlap said first exposure peak with said side-lobe thereof; and performing a lithography process by using a halftone mask with said main feature to form a plurality of second exposure peaks with a second pitch.

5. The method according to claim 4, wherein said first optical parameter comprises a Numerical Aperture (NA) parameter.

6. The method according to claim 4, wherein said second optical parameter comprises a sigma parameter.

7. The method according to claim 4, wherein the transmission of said halftone mask is about between 30% and 50%.

8. The method according to claim 4, wherein said halftone mask can equalize the intensity of said plurality of second exposure peaks.

9. The method according to claim 4, wherein said second pitch is about half said first pitch.

10. A method for reducing the pitch of the semiconductor devices, the method comprising:

providing a semiconductor substrate with a semiconductor layer thereon;

forming a photoresist layer on said semiconductor layer;

providing a first exposure peak of a main feature with a first width that is utilized for the lithography process, wherein a plurality of side-lobes are individually beside on the sidewalls of said first exposure peak, and said first exposure peak has a first pitch;

adjusting a first optical parameter of Numerical Aperture (NA) and a second optical parameter of sigma, so as to adjust the position of said side-lobe of said first exposure peak and overlap said first exposure peak with said side-lobe thereof;

performing a lithography process by using a halftone mask with said main feature to form a plurality of second exposure peaks with a second pitch, so as to form a plurality of photoresist regions on said semiconductor layer, wherein said halftone mask equalizes the intensity of said plurality of exposure peaks from each other, and said second pitch is half said first pitch; and performing an etching process by using said plurality of photoresist regions as photoresist masks to etch said semiconductor layer, so as to form a plurality of semiconductor regions with a second width.

11. The method according to claim 10, wherein said first optical parameter of Numerical Aperture (NA) is about 0.6.

12. The method according to claim 10, wherein said second optical parameter of sigma is about 0.6.

13. The method according to claim 10, wherein the transmission of said halftone mask is about 40%.

14. The method according to claim 10, wherein said lithography process comprises a deep ultraviolet process.

15. The method according to claim 10, wherein said second width is about half said first width.

* * * * *